(12) United States Patent
Lee

(10) Patent No.: US 11,810,894 B2
(45) Date of Patent: Nov. 7, 2023

(54) SOLDERLESS INTERCONNECT FOR SEMICONDUCTOR DEVICE ASSEMBLY

(71) Applicant: Micron Technology, Inc., Boise, ID (US)

(72) Inventor: Jungbae Lee, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/401,887

(22) Filed: Aug. 13, 2021

(65) Prior Publication Data
US 2021/0375822 A1 Dec. 2, 2021

Related U.S. Application Data

(63) Continuation of application No. 16/711,849, filed on Dec. 12, 2019, now Pat. No. 11,094,668.

(51) Int. Cl.
*H01L 21/78* (2006.01)
*H01L 23/00* (2006.01)
(Continued)

(52) U.S. Cl.
CPC .......... *H01L 24/81* (2013.01); *H01L 21/4853* (2013.01); *H01L 21/78* (2013.01);
(Continued)

(58) Field of Classification Search
CPC ......... H01L 24/81; H01L 24/83; H01L 24/32; H01L 24/94; H01L 24/16; H01L 24/73; H01L 24/11; H01L 24/92; H01L 21/4853; H01L 21/78; H01L 23/49816; H01L 2224/13147; H01L 2924/3512; H01L 2224/11464; H01L 2224/73204;
(Continued)

(56) References Cited

U.S. PATENT DOCUMENTS 5,891,753 A * 4/1999 Akram ................. H01L 23/552
257/E21.511
6,358,776 B1 * 3/2002 Takehara ............. H01L 23/544
257/E23.179
(Continued)

*Primary Examiner* — Vu A Vu
(74) *Attorney, Agent, or Firm* — Perkins Coie LLP

(57) ABSTRACT

Semiconductor device assemblies with solderless interconnects, and associated systems and methods are disclosed. In one embodiment, a semiconductor device assembly includes a first conductive pillar extending from a semiconductor die and a second conductive pillar extending from a substrate. The first conductive pillar may be connected to the second conductive pillar via an intermediary conductive structure formed between the first and second conductive pillars using an electroless plating solution injected therebetween. The first and second conductive pillars and the intermediary conductive structure may include copper as a common primary component, exclusive of an intermetallic compound (IMC) of a soldering process. A first sidewall surface of the first conductive pillar may be misaligned with respect to a corresponding second sidewall surface of the second conductive pillar. Such interconnects formed without IMC may improve electrical and metallurgical characteristics of the interconnects for the semiconductor device assemblies.

12 Claims, 8 Drawing Sheets

(51) Int. Cl.
*H01L 21/48* (2006.01)
*H01L 23/498* (2006.01)

(52) U.S. Cl.
CPC ........ *H01L 23/49816* (2013.01); *H01L 24/11* (2013.01); *H01L 24/16* (2013.01); *H01L 24/32* (2013.01); *H01L 24/73* (2013.01); *H01L 24/83* (2013.01); *H01L 24/92* (2013.01); *H01L 24/94* (2013.01); *H01L 2224/11013* (2013.01); *H01L 2224/11464* (2013.01); *H01L 2224/13147* (2013.01); *H01L 2224/16227* (2013.01); *H01L 2224/16238* (2013.01); *H01L 2224/32225* (2013.01); *H01L 2224/73204* (2013.01); *H01L 2224/8112* (2013.01); *H01L 2224/81193* (2013.01); *H01L 2224/92143* (2013.01); *H01L 2924/3511* (2013.01); *H01L 2924/3512* (2013.01)

(58) Field of Classification Search
CPC ... H01L 2224/8112; H01L 2224/81193; H01L 2924/3511; H01L 2224/92143; H01L 2224/11013; H01L 2224/32225; H01L 2224/16238; H01L 2224/16227
USPC .......................................................... 257/737
See application file for complete search history.

(56) References Cited

U.S. PATENT DOCUMENTS

| | | | | |
|---|---|---|---|---|
| 6,809,020 | B2 * | 10/2004 | Sakurai | H01L 24/12 257/E23.021 |
| 6,835,580 | B1 * | 12/2004 | Knapp | H01L 23/3107 257/E23.044 |
| 6,872,591 | B1 * | 3/2005 | Wang | H01L 24/82 438/106 |
| 7,884,632 | B2 * | 2/2011 | Shiraishi | G01R 1/07342 324/750.25 |
| 8,446,007 | B2 * | 5/2013 | Kuo | H05K 1/111 257/737 |
| 9,137,900 | B2 * | 9/2015 | Tanaka | H01L 24/97 |
| 9,331,047 | B2 * | 5/2016 | Ohashi | H05K 3/305 |
| 9,564,421 | B2 * | 2/2017 | Machida | H01L 23/5389 |
| 9,721,922 | B2 * | 8/2017 | Marimuthu | H01L 23/5383 |
| 11,094,668 | B2 * | 8/2021 | Lee | H01L 24/73 |
| 2002/0148733 | A1 * | 10/2002 | Saito | H05K 3/4623 205/333 |
| 2008/0073795 | A1 * | 3/2008 | Kohl | H01L 24/10 257/774 |
| 2012/0199981 | A1 * | 8/2012 | Jeong | H01L 25/50 257/773 |
| 2015/0179570 | A1 | 6/2015 | Marimuthu et al. | |
| 2021/0183811 | A1 | 6/2021 | Lee | |

* cited by examiner

SOLDERLESS INTERCONNECT FOR SEMICONDUCTOR DEVICE ASSEMBLY

CROSS-REFERENCE TO RELATED APPLICATIONS

This application is a continuation of U.S. patent application Ser. No. 16/711,849, filed Dec. 12, 2019, which is incorporated herein by reference in its entirety.

TECHNICAL FIELD

The present disclosure generally relates to semiconductor device assemblies, and more particularly relates to solderless interconnects for a semiconductor device assembly.

BACKGROUND

Semiconductor packages typically include a semiconductor die (e.g., memory chip, microprocessor chip, imager chip) mounted on a substrate, encased in a protective covering. The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

In some semiconductor packages, direct chip attach methods (e.g., a flip-chip bonding between the semiconductor die and the substrate) may be used to reduce footprints of the semiconductor packages. Such direct chip attach methods may include interfaces between different metallic materials in contact, which may form an inter-metallic compound (IMC). The IMC may degrade electrical characteristics at the interfaces (e.g., increased resistance) or cause reliability issues due to its metallurgical properties (e.g., brittleness). Further, annealing steps may be required to facilitate bonding between different metallic materials, which introduces thermal stresses to the semiconductor package. Such thermal stresses may lead to additional issues, such as cracks propagating in a passivation layer of the semiconductor die, warpages in the semiconductor die, the substrate, or both resulting in high resistance at the interfaces, or the like.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Specific details of several embodiments of semiconductor device assemblies ("assemblies") having solderless interconnects, and associated systems and methods are described below. The solderless interconnects may provide improved electrical characteristics and a reduced thermal budget during the assembly process, which in turn, improve reliability performances of the interconnects. The term "semiconductor device or die" generally refers to a solid-state device that includes one or more semiconductor materials. Examples of semiconductor devices include logic devices, memory devices, microprocessors, or diodes, among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. A person having ordinary skill in the relevant art will recognize that suitable steps of the methods described herein can be performed at the wafer level or at the die level.

Further, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques, some of which may be combined with photolithography steps. A person skilled in the relevant art will also understand that the technology may have additional embodiments, and that the technology may be practiced without several of the details of the embodiments described herein with reference to FIGS. 2 through 5.

As used herein, the terms "vertical," "lateral," "down," "up," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations.

Figure 1:
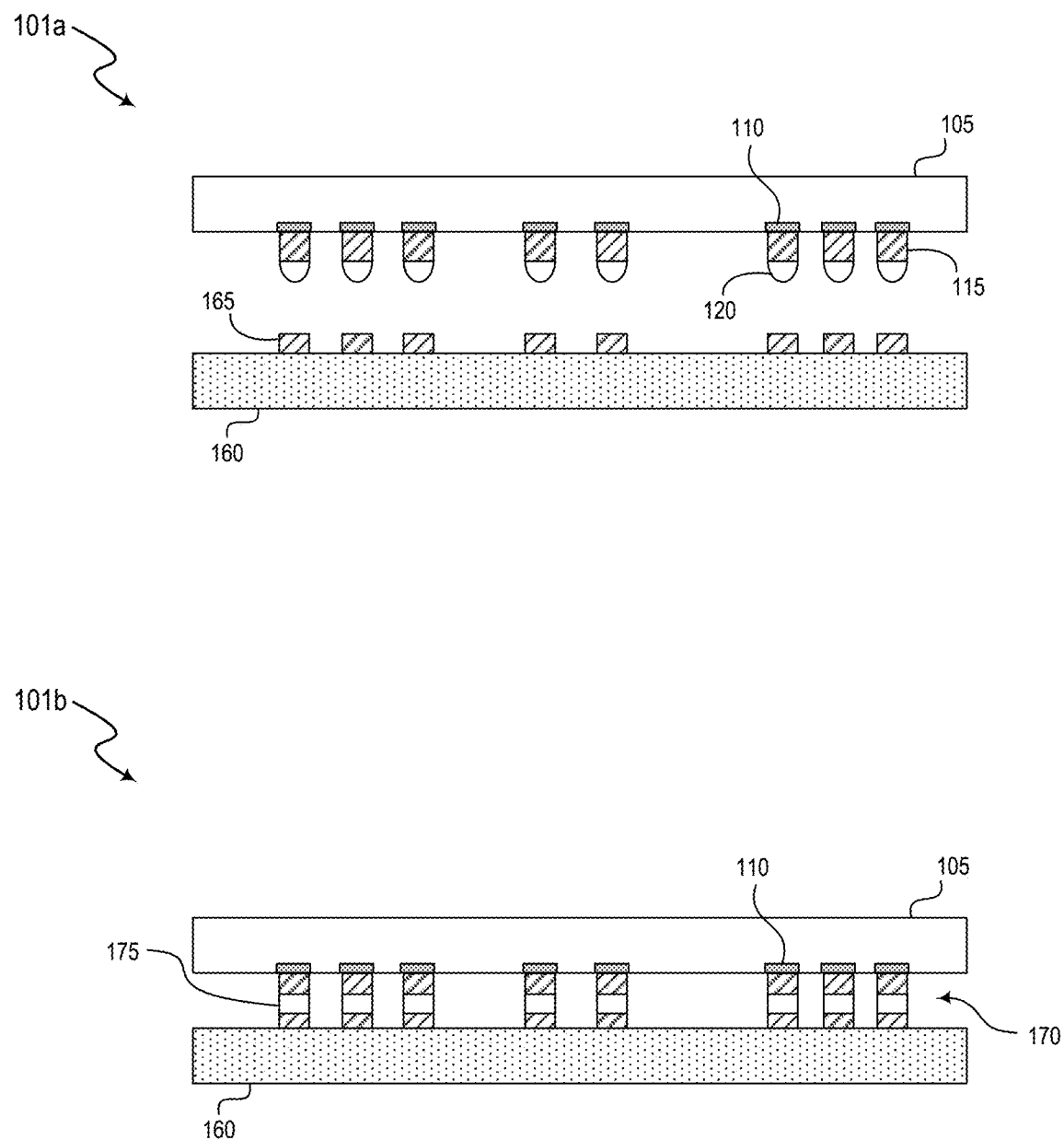
FIG. 1 illustrates cross-sectional diagrams of an exemplary semiconductor device assembly.

FIG. 1 illustrates cross-sectional diagrams 101a and 101b of an exemplary semiconductor device assembly. Diagram 101a includes a semiconductor die 105 and a substrate 160 before they are attached together to form the semiconductor device assembly. The semiconductor die 105 includes conductive pillars 115 formed on bond pads 110 of the semiconductor die 105. The bond pads 110 may be connected to various functional features of the semiconductor die 105. Further, solders 120 are formed on the conductive pillars 115. The semiconductor die 105 is "flipped" in FIG. 1 such that an active surface of the semiconductor die 105 faces the substrate 160, where the functional feature are formed on the active surface. The conductive pillars 115 may include copper (Cu) and the solders 120 may include a tin-based alloy. The substrate 160 includes conductive structures 165 that may be further connected to terminals (not shown) outside a protective covering of the semiconductor device assembly. The conductive structures 165 may include copper.

Diagram 101b depicts the semiconductor device assembly including the semiconductor die 105 and the substrate 160 after they are attached to each other via interconnects 170—e.g., the semiconductor die 105 is flip-chip bonded to the substrate 160. The interconnects 170 includes the conductive pillars 115 connected to the conductive structures 165 via IMCs 175. The IMCs 175 may form during an annealing step (e.g., soldering process) performed after the solders 120 are brought in contact with the conductive structures 165 so as to facilitate bonding between the solders 120 and the conductive structures 165. In some examples, the soldering process may reach to approximately 230-degrees Celsius to melt the solders 120. The IMCs 175 may include a metallic compound comprising Cu (e.g., Cu of the conductive pillars 115 or the conductive structures 165, or both) and Sn (e.g., tin of the solders 120).

Drawbacks associated with the IMCs 175 originate from electrical and metallurgical characteristics of the IMCs 175. In some examples, the IMCs 175 may degrade electrical conductivity of interconnects 170 due to Sn intermixing with Cu during the annealing step (which may be referred to as Sn consuming Cu). Additionally, the IMCs 175 may not be as malleable as Cu (e.g., more brittle when compared to Cu) to result in weak spots in the interconnects 170 (e.g., interfaces between the IMCs 175 and Cu of the conductive pillars 115 or the conductive structures 165, or both), which tend to develop catastrophic failures (e.g., opens in the interconnects 170) during reliability tests or the lifetime of semiconductor device assembly. Further, the heating and cooling associated with the annealing step may exacerbate additional reliability issues (e.g., cracks may form and propagate in a passivation layer of the semiconductor die 105) or cause warpages in the semiconductor die 105, the substrate 160, or both. Such warpages may increase resistance of the interconnect 170 or even lead to electrical discontinuities rendering the interconnects 170 non-functional.

FIGS. 2A through 2E illustrate a process of forming solderless interconnects for a semiconductor device assembly in accordance with an embodiment of the present technology. As described herein, the solderless interconnects may be fabricated by using a low thermal-budget electroless plating process. The solderless interconnects can improve electrical and metallurgical characteristics of interconnects by eliminating intermetallic compounds (e.g., IMCs 175) and associated interfaces (e.g., interfaces between Cu and IMCs). Further, forming the solderless interconnects using the low thermal-budget electroless plating process mitigates the additional reliability issues or the warpage issues due to the lower thermal-budget associated with the electroless plating process when compared to the soldering process.

Figure 2A:
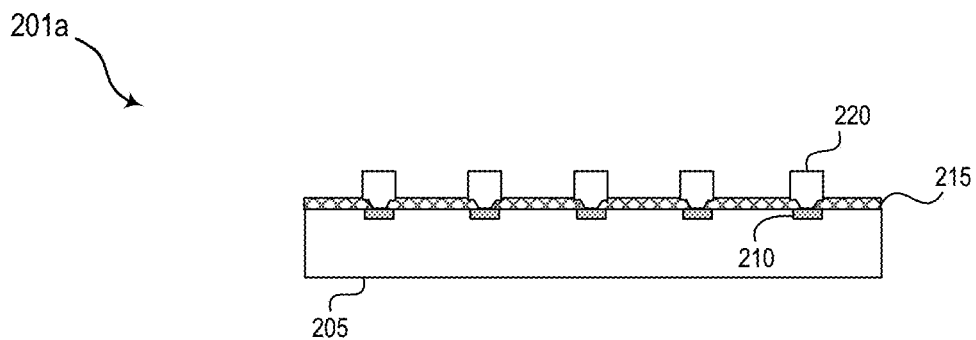
FIGS. 2A through 2E illustrate a process of forming solderless interconnects for a semiconductor device assembly in accordance with an embodiment of the present technology.

FIG. 2A illustrates a cross-sectional diagram 201a of a semiconductor die 205. The semiconductor die 205 includes bond pads 210 that are connected to various functional features of the semiconductor die 205. The semiconductor die 205 may be covered with a first passivation layer 215 that includes openings located above the bond pads 210. In some embodiments, the first passivation layer 215 may include a dielectric material (e.g., oxi-nitride) formed on the semiconductor die 205, on which the openings are formed (e.g., using a photolithography process and an etching process) above the bond pads 210 to expose the bond pads 210. Additionally or alternatively, the first passivation layer 215 may include a solder resist including a dielectric material, on which openings are formed above the bond pads 210, in some embodiments. Further, the semiconductor die 205 includes first conductive pillars 220 formed in contact with the bond pads 210. In some embodiments, the first conductive pillars 220 include copper (Cu) as a primary component (or a primary constituent). As such, the first conductive pillars 220 may be referred to as Cu-pillars.

Figure 2B:
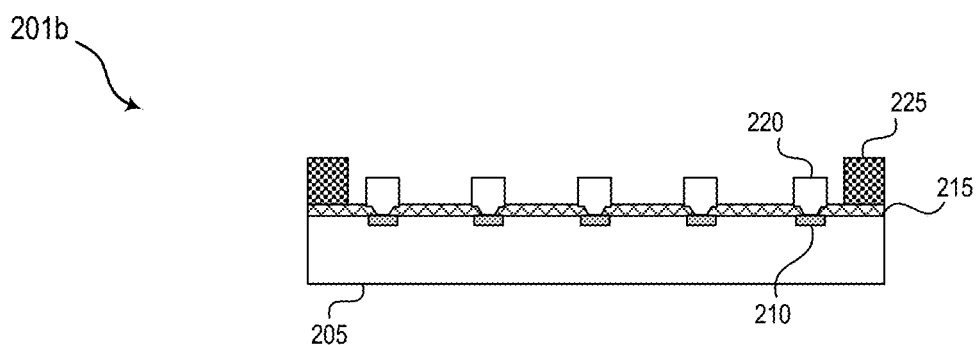
Figure 2B:
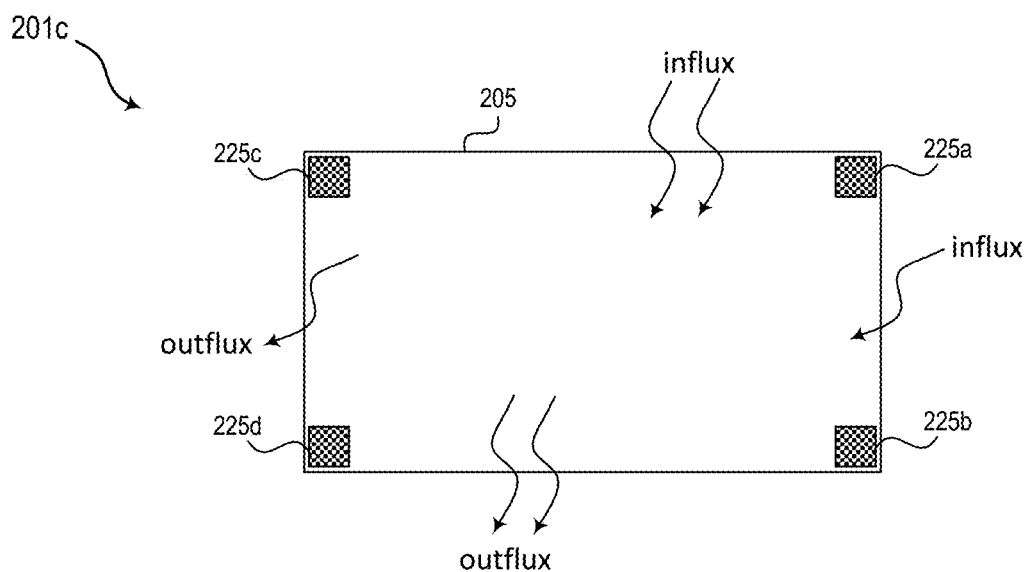

FIG. 2B illustrates a cross-sectional diagram 201b of the semiconductor die 205 with adhesive members 225 attached to the semiconductor die 205. In some embodiments, the adhesive members 225 includes a die-attach-film (DAF). FIG. 2B also illustrates a plan-view diagram 201c depicting locations of the adhesive members 225 with respect to the semiconductor die 205. The adhesive members 225 are disposed to include spaces to facilitate inflow or outflow of a solution as indicated in the diagram 201c. In some embodiments, the adhesive members 225 may attached to a substrate (e.g., the substrate 260 described with reference to FIG. 2C) instead of the semiconductor die 205. Although the diagram 201c depicts four adhesive members (e.g., adhesive members 225a through 225d) with each adhesive member 225 located at four corners of the semiconductor die 205, respectively, the present technology is not limited thereto. For example, additional adhesive members 225 may be disposed along any side of the semiconductor die 205. In another example, the four adhesive members 225 may be located on four sides of the semiconductor die 205, i.e., one adhesive member 225 per one side of the semiconductor die 205. Further, the shape of adhesive members 225 may include other shapes than the square shape as depicted in the diagram 201, such as a rectangular or elongated-rectangular shape, a circular or an elliptic shape, or the like.

Figure 2C:
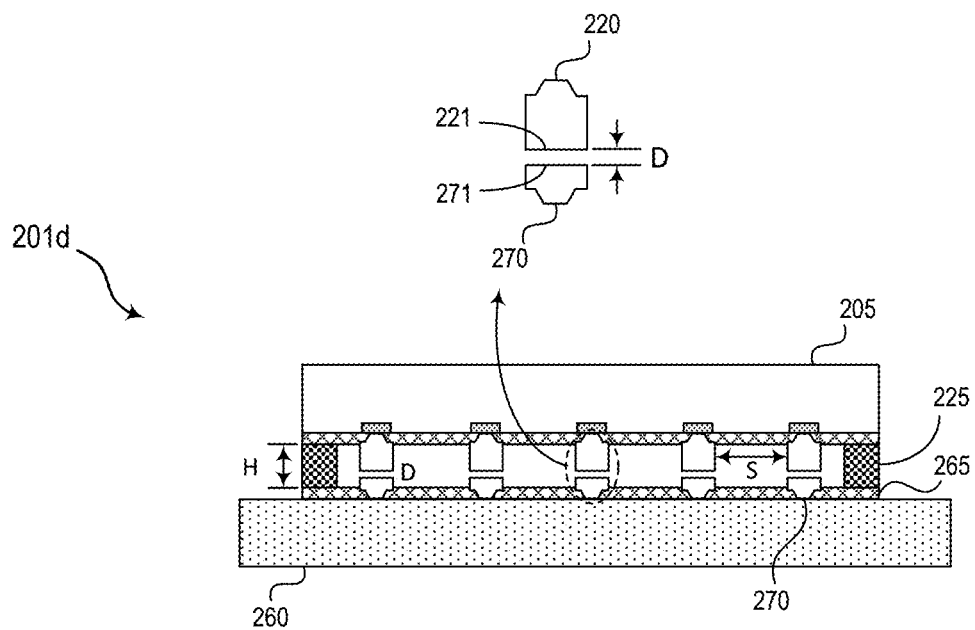

FIG. 2C illustrates a cross-sectional diagram 201d of the semiconductor assembly after the semiconductor die 205 is attached to a substrate 260 through the adhesive members 225. The substrate 260 includes second conductive pillars 270. In some embodiments, the second conductive pillars 270 may include copper (Cu) as a primary component (or a primary constituent). As such, the second conductive pillars 270 may be referred to as second Cu-pillars. In some embodiments, the second conductive pillars 270 may be referred to as conductive bumps. In some embodiments, organic solderability preservatives (OSP) may cover the second conductive pillars 270 and/or other conductive features (e.g., Cu traces) of the substrate 260. In such embodiments, the OSP may be removed before the semiconductor die 205 is attached to the substrate 260. In some embodiments, the second conductive pillars 270 may be connected to terminals outside of a protective covering (e.g., a casing of the semiconductor assembly including the semiconductor die 205 and the substrate 260). In some embodiments, the substrate 260 may be another semiconductor die similarly configured like the semiconductor die 205. In such embodiments, the second conductive pillars 270 may be connected to second bond pads (not shown), which in turn, are connected to functional features of the substrate 260. Further, the substrate 260 includes a second passivation layer 265 that covers metallic features of the substrate 260 except the second conductive pillars 270. In some embodiments, the second passivation layer 265 may be an example of or include aspects of the first passivation layer 215.

As shown in FIG. 2C, individual first conductive pillars 220 may be aligned with corresponding individual second conductive pillars 270. Further, cross-sectional dimensions (e.g., diameters, cross-sectional areas) of the first conductive pillars 220 and the second conductive pillars 270 are illustrated to be approximately identical. But the present technology is not limited thereto. For example, the cross-sectional dimensions of the first conductive pillars 220 may be different from the cross-sectional dimensions of the second conductive pillars 270. The height (denoted as H in FIG. 2C) of the adhesive members 225 may be configured to leave a distance or a gap (denoted as D in FIG. 2C) between the first conductive pillars 220 and the second conductive pillars 270 when the semiconductor die 205 is attached to the substrate 260—e.g., a first surface 221 of the first conductive pillar 220 is separated from a second surface 271 of the second conductive pillar 270 by the distance D. In some embodiments, the height H may be approximately 15 µm and the distance D may be approximately 10 µm. Further, the distance D may be determined based on a space (denoted as S in FIG. 2C) between two adjacent first conductive pillars 220 (or second conductive pillars 270). In some embodiments, the smallest space between two adjacent first (or second) conductive pillars may be greater than the distance D. In some embodiments, the smallest space between two conductive pillars may be approximately 25 µm.

Figure 2D:
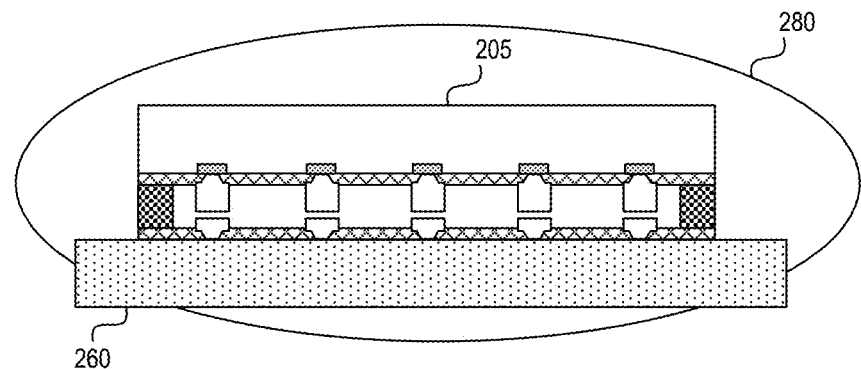

FIG. 2D illustrates that the semiconductor assembly including the semiconductor die 205 attached to the substrate 260 is placed (e.g., immersed) in a solution 280. In some embodiments, the solution 280 may include an electroless plating solution that forms a Cu-layer on a metallic surface exposed to the solution 280. In some embodiments, the solution 280 may be injected into the gaps between the first conductive pillars 220 and the second conductive pillars 270 to form a Cu-layer therebetween. In some embodiments, the solution 280 may be heated to facilitate the electroless plating process—e.g., to a temperature less than approximately 100-degrees Celsius.

Figure 2E:
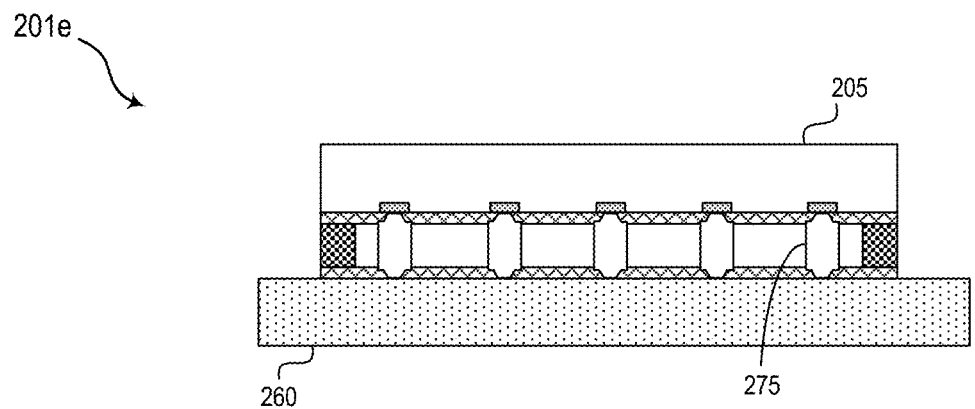
Figure 2E:
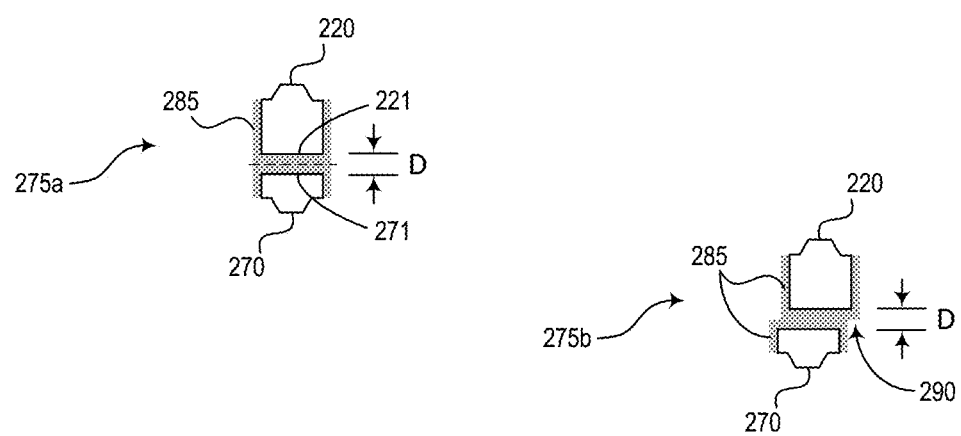
Figure 2E:
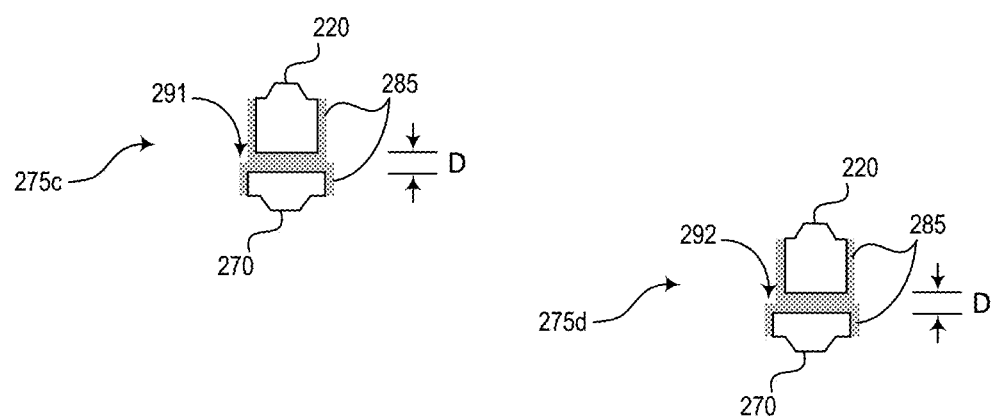

FIG. 2E illustrates a cross-sectional diagram 201*e* of the semiconductor assembly including the semiconductor die 205 attached to the substrate 260 and the interconnects 275 formed between the semiconductor die 205 and the substrate 260. FIG. 2E also illustrates various configurations in the interconnects (e.g., interconnects 275*a* through 275*d*).

The interconnect 275*a* illustrates the first conductive pillar 220 ideally aligned to the second conductive pillar 270 when diameters of the first conductive pillar 220 and the second conductive pillar 270 are approximately identical. The interconnect 275*a* depicts that a first sidewall surface of the first conductive pillar 220 is aligned with respect to a corresponding second sidewall surface of the second conductive pillar 270 without forming a step or a protrusion in the interconnect 275*a*. Further, the interconnect 275*a* depicts the first conductive pillar 220, the second conductive pillar 270, as well as a third conductive structure 285 depicted as a gray feature.

The third conductive structure 285 may include a conductive material (e.g., copper) that has been formed with the solution 280 during the low thermal-budget electroless plating process. That is, the third conductive structure 285 includes the conductive material (e.g., copper) simultaneously plated on the first surface 221 and the second surface 271 with the solution 280, which conjoins the first top surface 221 and the second surface 271—i.e., the third conductive structure 285 connects the first surface 221 of the first conductive pillar 220 to the second surface 271 of the second conductive pillar 270. The dotted line between the first conductive pillar 220 and the second conductive pillar 270 depicts a mid-location within the gap (denoted as D) where two advancing Cu-surfaces may join during the low thermal-budget electroless plating process—i.e., a first Cu-surface advancing from the first surface 221 of the first conductive pillar 220, a second Cu-surface advancing from the second surface 271 of the second conductive pillar 270. Further, the third conductive structure 285 includes an intermediary portion located between the first conductive pillar 220 and the second conductive pillar 270 (i.e., the intermediary portion of the conductive material corresponding to the diameters of the first conductive pillar 220 and the second conductive pillar 270), and a peripheral portion surrounding sidewall surfaces of the first conductive pillar 220 and the second conductive pillar 270 (i.e., the peripheral portion of the conductive material formed on the sidewall surfaces of the first and second conductive pillars).

Interconnect 275*b* illustrates the first conductive pillar 220 misaligned with respect to the second conductive pillar 270 when diameters of the first conductive pillar 220 and the second conductive pillar 270 are approximately identical. The interconnect 275*b* depicts that a first sidewall surface of the first conductive pillar 220 is misaligned with respect to a corresponding second sidewall surface of the second conductive pillar 270, thereby forming a protrusion or a step 290. A width of the ledge of step 290 may be approximately uniform around the interconnect 275*b*.

Interconnect 275*c* illustrates the first conductive pillar 220 ideally aligned with respect to the second conductive pillar 270 when diameters of the first conductive pillar 220 and the second conductive pillar 270 are different. The interconnect 275*c* depicts that a first sidewall surface of the first conductive pillar 220 is misaligned with respect to a corresponding second sidewall surface of the second conductive pillar 270, thereby forming a protrusion or a step 291. A width of the ledge of step 291 may be approximately uniform around the interconnect 275*c*.

Interconnect 275*d* illustrates the first conductive pillar 220 misaligned with respect to the second conductive pillar 270 when diameters of the first conductive pillar 220 and the second conductive pillar 270 are different. The interconnect 275*d* depicts that a first sidewall surface of the first conductive pillar 220 is misaligned with respect to a corresponding second sidewall surface of the second conductive pillar 270, thereby forming a protrusion or a step 292. A width of the ledge of step 292 may be varying around the interconnect 275*d*.

In some embodiments, a semiconductor device assembly may include a first metal structure extending from a first side of a semiconductor die, a second metal structure extending from a first side of a substrate that faces the first side of the semiconductor die, and a third metal structure conjoining the first metal structure and the second metal structure, where the third metal structure is formed with an electroless plating solution injected between the first metal structure and the second metal structure. Further, the first, second, and third metal structures may include a common primary metallic component (or constituent). In some embodiments, the common primary metallic component includes copper. In some embodiments, a first sidewall surface of the first metal structure is misaligned with respect to a corresponding second sidewall surface of the second metal structure. The semiconductor device assembly may further include one or more adhesive members configured to attach the semiconductor die to the substrate and to facilitate inflow or outflow of the electroless plating solution. In some embodiments, a thickness of the one or more adhesive members correlates to a sum of a first height of the first metal structure, a second height of the second metal structure, and a thickness of the third metal structure, respectively in a perpendicular direction with respect to either the first side of the semiconductor die or the substrate.

Figure 3A:
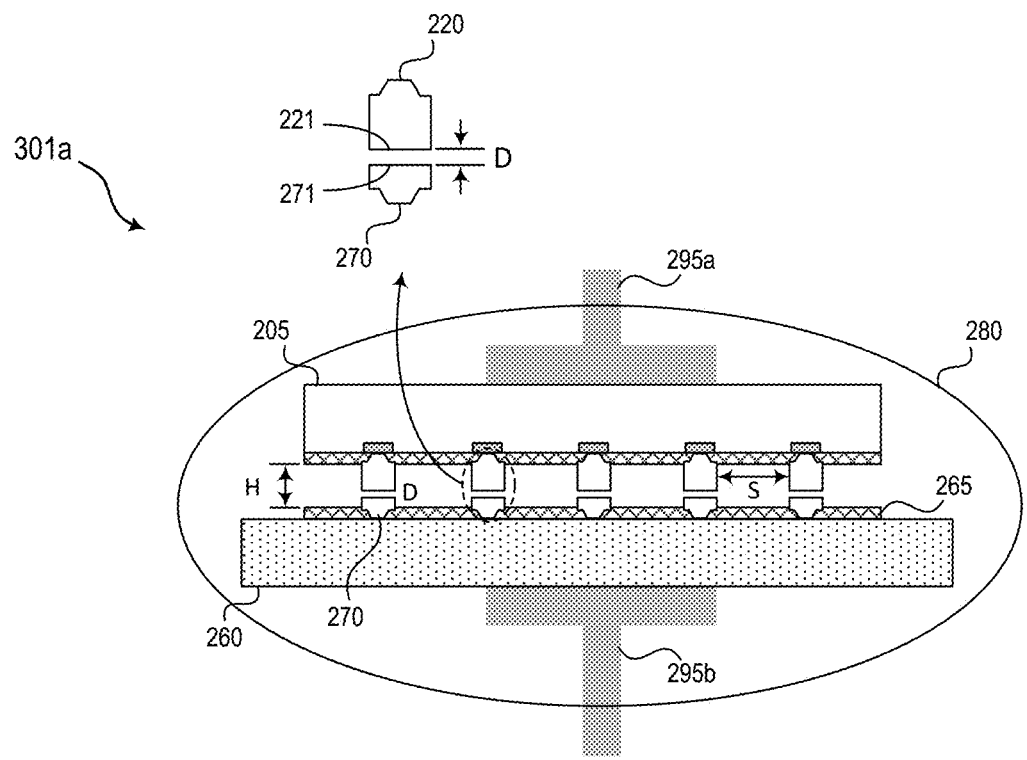
FIGS. 3A and 3B illustrate a process of forming solderless interconnects for a semiconductor device assembly in accordance with an embodiment of the present technology.

FIG. 3A illustrates a cross-sectional diagram 301a including the semiconductor die 205 and the substrate 260, where the semiconductor die 205 is brought proximate to the substrate 260. The individual first conductive pillars 220 are aligned with respect to the individual second conductive pillars 270, where the first surfaces 221 of the first conductive pillars 220 face the second surface 271 of the second conductive pillars 270. Further, the first surfaces 221 of the first conductive pillars 220 are separated from the second surface 271 of the second conductive pillars 270 by the distance D. In this regard, the diagram 301a corresponds to the diagram 201d described with reference to FIG. 2C, except that support components 295 are added in lieu of the adhesive members 225 that has been omitted. That is, the semiconductor die 205 may be supported by a first support component 295a while the substrate 260 may be supported by a second support component 295b.

Such support components may be configured to hold an object (e.g., the semiconductor die 205, the substrate 260) via vacuum suction or electrostatic suction (or other suitable support mechanisms). In this manner, the semiconductor die 205 and the substrate 260 may be arranged as shown in the diagram 301a by manipulating the first and second support components 295 without the adhesive members 225. Moreover, the semiconductor die 205 and the substrate 260, while supported by the first and second support components 295, respectively, may be immersed in the solution 280 (e.g., the electroless plating solution) to conjoin the first surfaces 221 and the second surfaces 271 by simultaneously plating a conductive material (e.g., copper) on both the first surfaces 221 and the second surfaces 271 with the electroless plating solution—i.e., connecting the first conductive pillars 220 to the corresponding second conductive pillars 270. In some cases, the solution 280 may be injected into the gaps between the first conductive pillars 220 and the second conductive pillars 270 to form a Cu-layer therebetween as described with reference to FIG. 2D. Lack of the adhesive members 225 may facilitate a relatively easier inflow and/or outflow of the electroless plating solution between the first surfaces 221 and the second surfaces 271 when compared to the embodiment using the adhesive members 225.

Figure 3B:
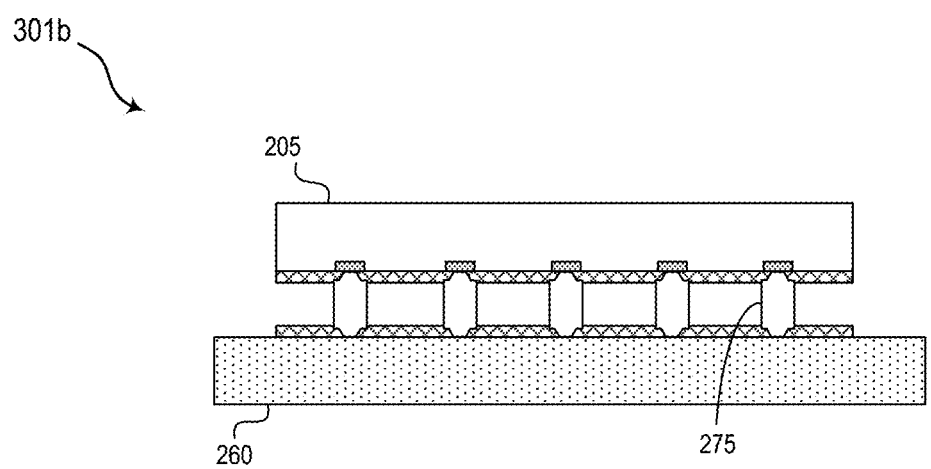

FIG. 3B illustrates a cross-sectional diagram 301b of the semiconductor assembly including the semiconductor die 205 attached to the substrate 260 and the interconnects 275 formed between the semiconductor die 205 and the substrate 260. The support components 295 may be removed from the semiconductor die 205 and the substrate 260 after the semiconductor die 205 is attached to the substrate 260 through the interconnects 275. In this regard, the diagram 301b corresponds to the diagram 201e described with reference to FIG. 2E, except the adhesive members 225 that has been omitted. Further, the interconnects 275 of the diagram 301 may include the various configurations in interconnects (e.g., interconnects 275a through 275d depicted in FIG. 2E) as described with reference to FIG. 2E.

Although the processes of forming solderless interconnects with reference to FIGS. 2A through 2E, 3A, and 3B illustrate a die level process steps—e.g., a singulated semiconductor die (e.g., the semiconductor die 205) attached to a singulated substrate (e.g., the substrate 260), the processes may be applied to wafer level process steps. In some embodiments, a semiconductor wafer may include a first semiconductor die including a first plurality of copper-pillars and a second semiconductor die including a second plurality of copper-pillars. The semiconductor wafer may be brought proximate to a package support substrate including a first group of conductive bumps and a second group of conductive bumps such that individual copper-pillars of the first and second pluralities are aligned with respect to individual conductive bumps of the first and second groups. In some embodiments, the conductive bumps of the first and second groups may include copper as a primary component.

Further, the first and second pluralities of copper-pillars face the first and second groups of conductive bumps, and the first and second pluralities of copper-pillars are separated from the first and second groups of conductive bumps by a distance (e.g., the distance D as described with reference to FIG. 2C or FIG. 3A). Subsequently, individual copper-pillars of the first and second pluralities may be connected to individual conductive bumps of the first and second groups via conductive materials (e.g., copper) formed in an electroless plating solution injected between the first and second pluralities of copper-pillars and the first and second groups of conductive bumps.

In some embodiments, bringing the semiconductor wafer proximate to the package support substrate may further include bonding the semiconductor wafer to the package support substrate using one or more adhesive members before connecting the individual copper-pillars of the first and second pluralities to the individual conductive bumps of the first and second groups. In such embodiments, a thickness of the one or more adhesive members may be configured to maintain the distance (e.g., the distance D as described with reference to FIG. 2C) between first top surfaces of the copper-pillars of the first and second pluralities and second top surfaces of the conductive bumps of the first and second groups after bonding the semiconductor wafer to the package support substrate. In some embodiments, the distance may be less than a lateral distance between the copper-pillars of the first plurality or the second pluralities.

In some embodiments, bringing the semiconductor wafer proximate to the package support substrate may further include supporting the semiconductor wafer and the package support substrate using support components, respectively (e.g., the support components 295 described with reference to FIGS. 3A and 3B) before connecting the individual copper-pillars of the first and second pluralities to the individual conductive bumps of the first and second groups. In such embodiments, the support components may be manipulated to maintain the distance (e.g., the distance D as described with reference to FIG. 3A) between first top surfaces of the copper-pillars of the first and second pluralities and second top surfaces of the conductive bumps of the first and second groups. In some embodiments, the distance may be less than a lateral distance between the copper-pillars of the first plurality or the second pluralities.

Further, after the individual copper-pillars of the first and second pluralities are connected to the individual conductive bumps of the first and second groups, the semiconductor wafer may be singulated along a dicing lane between the first and second semiconductor dies. Also, the package support substrate may be singulated concurrently along the dicing lane while singulating the semiconductor wafer, where the dicing lane is between the first and second groups of conductive bumps.

Figure 4:
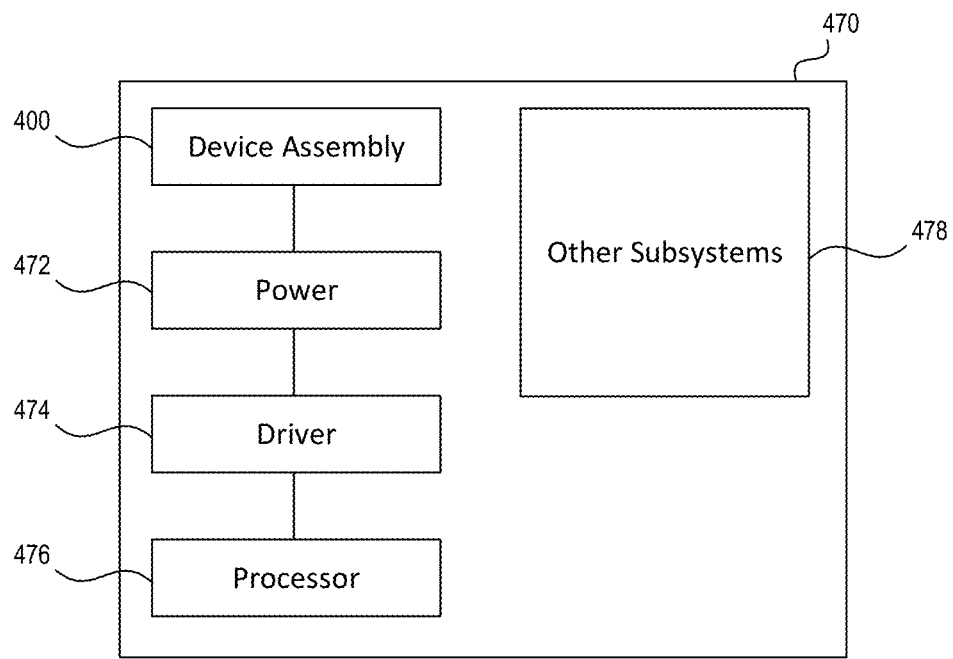
FIG. 4 is a block diagram schematically illustrating a system including a semiconductor device assembly configured in accordance with an embodiment of the present technology.

Any one of the semiconductor device assemblies described above with reference to FIG. 2 can be incorporated into any of a myriad of larger and/or more complex systems, a representative example of which is the system 470 shown schematically in FIG. 4. The system 470 can include a semiconductor device assembly 400, a power source 472, a driver 474, a processor 476, and/or other subsystems or components 478. The semiconductor device assembly 400 can include features generally similar to those of the solderless interconnects described herein, and can therefore include various features that enhance electrical and metallurgical characteristics of the interconnects. The resulting system 470 can perform any of a wide variety of functions, such as memory storage, data processing, and/or other suitable functions. Accordingly, representative systems 470 can include, without limitation, hand-held devices (e.g., mobile phones, tablets, digital readers, and digital audio players), computers, and appliances. Components of the system 470 may be housed in a single unit or distributed over multiple, interconnected units (e.g., through a communications network). The components of the system 470 can also include remote devices and any of a wide variety of computer readable media.

Figure 5:
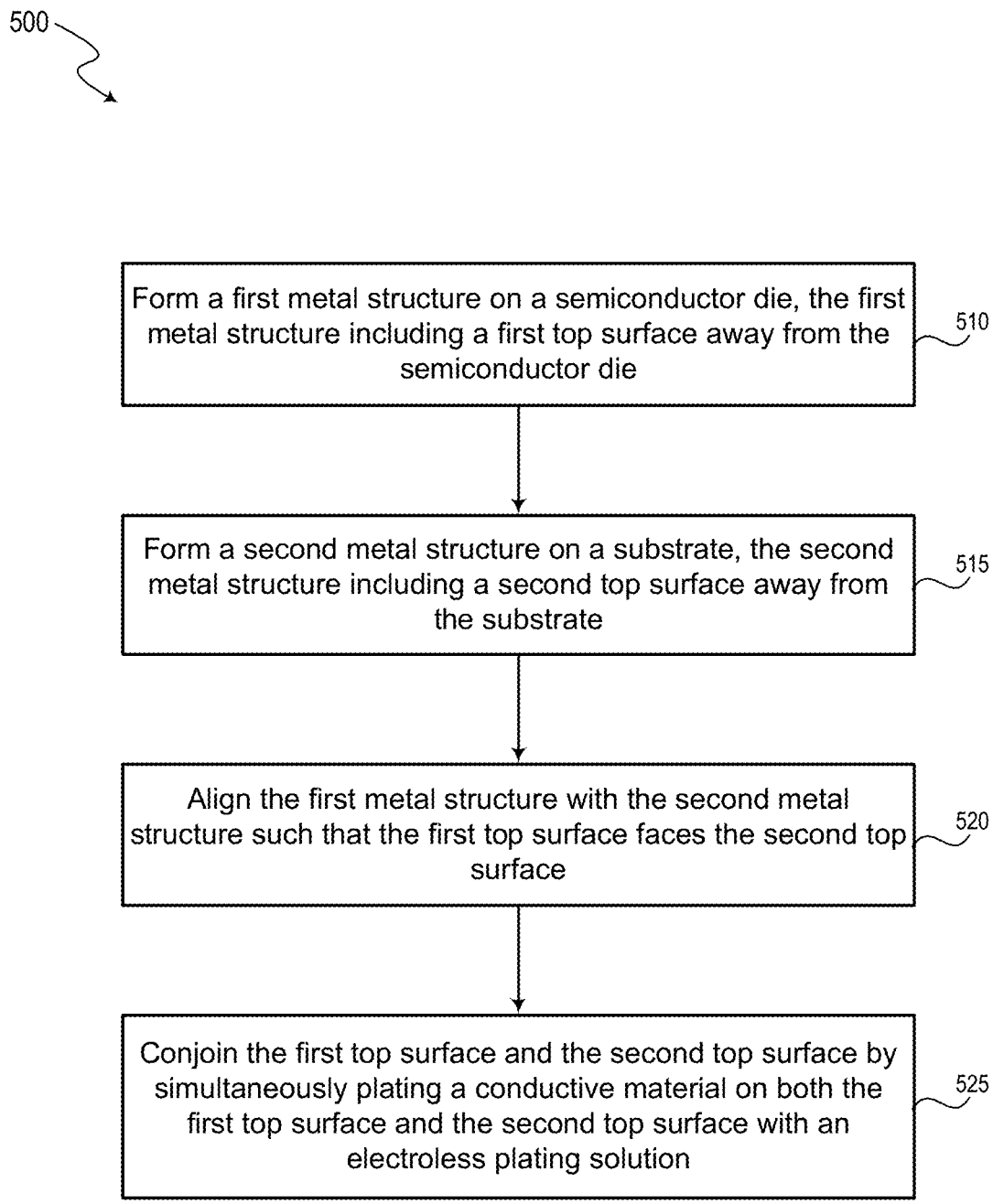
FIGS. 5 and 6 are flowcharts illustrating methods of forming solderless interconnects for a semiconductor device assembly in accordance with embodiments of the present technology.

FIG. 5 is a flowchart 500 illustrating a method of forming solderless interconnects for a semiconductor device assembly in accordance with an embodiment of the present technology. The flowchart 500 may include aspects of methods as described with reference to FIGS. 2A through 2E, 3A, and 3B.

The method includes forming a first metal structure on a semiconductor die, the first metal structure including a first top surface away from the semiconductor die (box 510). The method further includes forming a second metal structure on a substrate, the second metal structure including a second top surface away from the substrate (box 515). The method further includes aligning the first metal structure with the second metal structure such that the first top surface faces the second top surface (box 520). The method further includes conjoining the first top surface and the second top surface by simultaneously plating a conductive material on both the first top surface and the second top surface with an electroless plating solution (box 525).

In some embodiments, the method may further include injecting the electroless plating solution between the first top surface and the second top surface, wherein plating the conductive material is based at least in part on injecting the electroless plating solution. In some embodiments, the method may further include heating the electroless plating solution injected between the first top surface and the second top surface, wherein plating the conductive material is based at least in part on heating the electroless plating solution. In some embodiments, the method may further include attaching one or more adhesive members to the semiconductor die, prior to aligning the first metal structure with the second metal structure. In some embodiments, the one or more adhesive members are configured to facilitate inflow or outflow of the electroless plating solution.

In some embodiments, the method may further include bonding, before forming the conductive material, the semiconductor die to the substrate using one or more adhesive members. In some embodiments, a thickness of the one or more adhesive members may be configured to provide a separation between the first top surface and the second top surface after bonding the semiconductor die to the substrate, the separation less than a lateral distance between the first metal structure and a third metal structure on the semiconductor die that is adjacent to the first metal structure. In some embodiments, the first metal structure, the second metal structure, and the conductive material include copper as a primary component (or constituent), respectively.

In some embodiments, the substrate includes a package support substrate or a second semiconductor die. In some embodiments, the method may further include bringing the semiconductor die to the substrate such that the first metal structure that has been aligned to the second metal structure is separated by a gap between the first top surface and the second top surface, where the gap is less than a lateral distance between the first metal structure and a third metal structure on the semiconductor die that is adjacent to the first metal structure.

Figure 6:
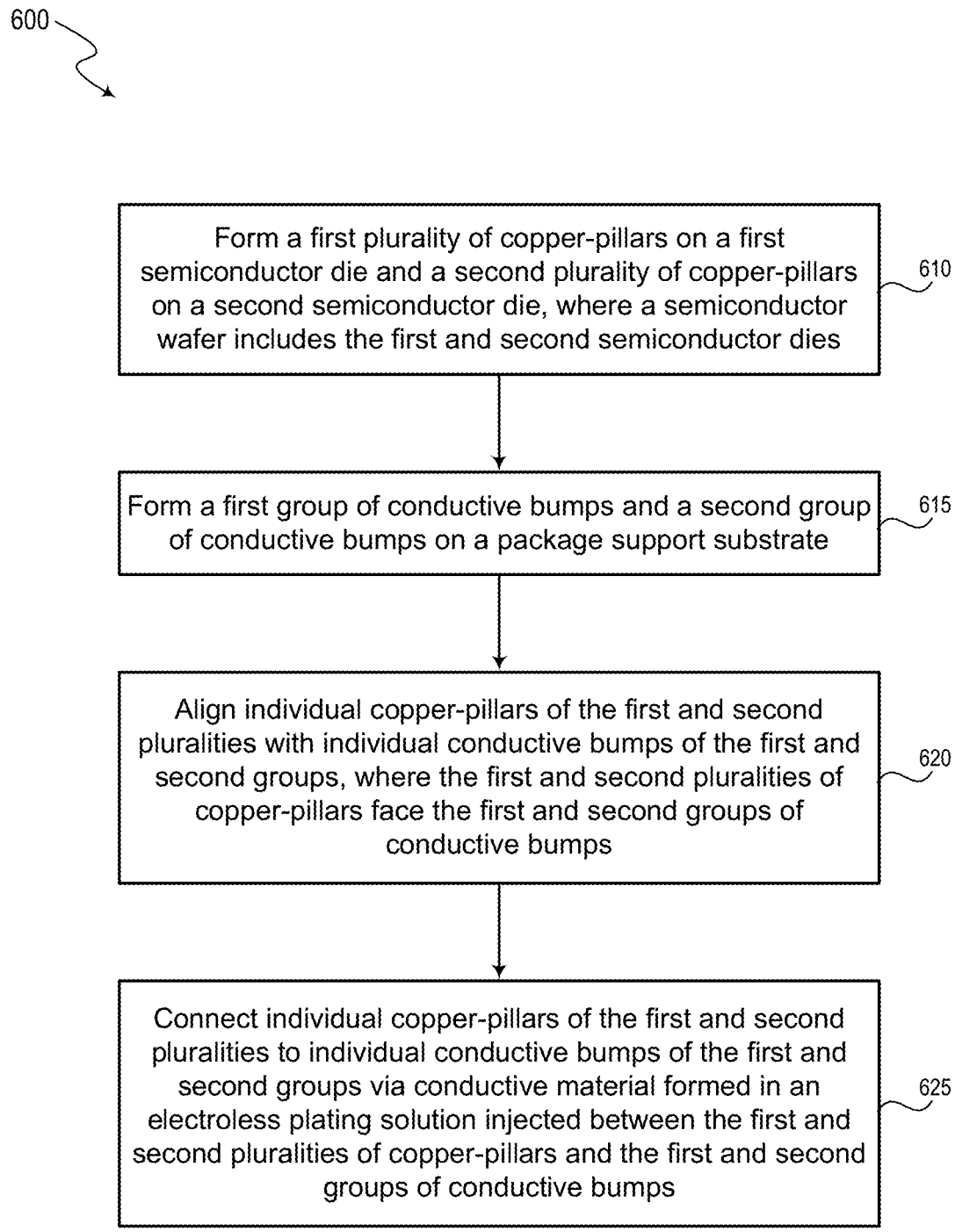

FIG. 6 is a flowchart 600 illustrating a method of forming solderless interconnects for a semiconductor device assembly in accordance with an embodiment of the present technology. The flowchart 600 may include aspects of methods as described with reference to FIGS. 2A through 2E, 3A, and 3B.

The method includes forming a first plurality of copper-pillars on a first semiconductor die and a second plurality of copper-pillars on a second semiconductor die, where a semiconductor wafer includes the first and second semiconductor dies (box 610). The method further includes forming a first group of conductive bumps and a second group of conductive bumps on a package support substrate (box 615). The method further includes aligning individual copper-pillars of the first and second pluralities with individual conductive bumps of the first and second groups, where the first and second pluralities of copper-pillars face the first and second groups of conductive bumps (box 620). The method further includes connecting individual copper-pillars of the first and second pluralities to individual conductive bumps of the first and second groups via conductive material formed in an electroless plating solution injected between the first and second pluralities of copper-pillars and the first and second groups of conductive bumps (box 625).

In some embodiments, the method may further include bonding the semiconductor wafer to the package support substrate using one or more adhesive members, before connecting the individual copper-pillars of the first and second pluralities to the individual conductive bumps of the first and second groups. In some embodiments, a thickness of the one or more adhesive members may be configured to provide a separation between first top surfaces of the copper-pillars of the first and second pluralities and second top surfaces of the conductive bumps of the first and second groups after bonding the semiconductor wafer to the package support substrate, the separation less than a lateral distance between the copper-pillars of the first plurality or the second pluralities.

In some embodiments, the method may further include singulating the semiconductor wafer along a dicing lane between the first and second semiconductor dies, after connecting individual copper-pillars of the first and second pluralities to individual conductive bumps of the first and second groups. In some embodiments, the method may further include concurrently singulating the package support substrate along the dicing lane while singulating the semiconductor wafer, wherein the dicing lane is between the first and second groups of conductive bumps.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the technology have been described herein for purposes of illustration, but that various modifications may be made without deviating from the disclosure. For example, although the embodiments of the semiconductor device assemblies are described with respect to a single semiconductor die attached to a substrate, other embodiments of the semiconductor device assemblies can be configured, for example, to include more than one semiconductor die, such as stacked semiconductor dies, hybrid memory cubes (HMCs), or the like. In addition, while in the illustrated embodiments certain features or components have been shown as having certain arrangements or configurations, other arrangements and configurations are possible. For example, the first conductive pillars 220 and the second conductive pillars 270 can include a larger or smaller number of conductive pillars than shown in the illustrated embodiments. In addition, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
   a substrate;
   a semiconductor die; and
   a plurality of interconnects extending between the substrate and the semiconductor die and configured to operatively couple the semiconductor die with the substrate, each interconnect of the plurality including a portion formed in an electroless plating solution, wherein:
   the portion has a peripheral part forming a sidewall of the interconnect and an intermediary part conjoining a conductive pillar of the semiconductor die and a conductive pad of the substrate and surrounding sidewalls of the conductive pillar; and
   a region between the semiconductor die and the substrate and coextensive with a footprint of the semiconductor die is absent any structures apart from the plurality of interconnects,
   wherein the conductive pillar of the semiconductor die and the conductive pad of the substrate are surrounded by the peripheral part.

2. The semiconductor device assembly of claim 1, wherein the electroless plating solution is heated to a temperature less than 100 degrees Celsius.

3. The semiconductor device assembly of claim 1, wherein at least a pair of the interconnects of the plurality has a distance between them less than 15 μm.

4. The semiconductor device assembly of claim 1, wherein the conductive pillar of the semiconductor die and the conductive pad of the substrate have approximately the same diameter.

5. The semiconductor device assembly of claim 4, wherein at least one interconnect of the plurality has a ledge due to a first sidewall surface of the conductive pillar misaligned with respect to a second sidewall surface of the conductive pad.

6. The semiconductor device assembly of claim 1, wherein the conductive pillar of the semiconductor die have a first diameter, and the conductive pad of the substrate have a second diameter different than the first diameter.

7. The semiconductor device assembly of claim 6, wherein at least one interconnect of the plurality has a ledge with a width approximately uniform around the at least one interconnect.

8. The semiconductor device assembly of claim 6, wherein at least one interconnect of the plurality has a ledge with a nonuniform width around the at least one interconnect.

9. A semiconductor device assembly, comprising:
   a substrate;
   a semiconductor die;
   a plurality of interconnects extending between the substrate and the semiconductor die and configured to operatively couple the semiconductor die with the substrate, each interconnect of the plurality including a portion formed in an electroless plating solution and surrounding sidewalls of a conductive pillar of the semiconductor die; and
   a plurality of adhesive members extending between the substrate and the semiconductor die, wherein each adhesive member of the plurality is located in an outer area of the semiconductor die, the outer area between edges of the semiconductor die and outermost interconnects of the plurality, and wherein an inner area defined by inner borders of the outer area is absent any structures apart from the plurality of interconnects.

10. The semiconductor device assembly of claim 9, wherein the portion includes a peripheral part forming a sidewall of the interconnect and an intermediary part conjoining a conductive pillar of the semiconductor die and a conductive pad of the substrate.

11. The semiconductor device assembly of claim 10, wherein a thickness of the adhesive members of the plurality correlates to a sum of a first height of the conductive pillar, a second height of the conductive pad, and a thickness of the intermediary part.

12. The semiconductor device assembly of claim 9, wherein each adhesive member of the plurality is formed before being placed between the substrate and the semiconductor die.

* * * * *